United States Patent [19]

Browne et al.

[11] Patent Number: 4,600,679
[45] Date of Patent: Jul. 15, 1986

[54] WATER-DEVELOPABLE, NEGATIVE-WORKING, DIAZO LITHOGRAPHIC PRINTING PLATE WITH OLEOPHILIC ESTER OVERLAYER

[75] Inventors: Alan R. Browne, Columbia; Charles R. Morgan, Brookeville, both of Md.

[73] Assignee: W. R. Grace & Co., New York, N.Y.

[21] Appl. No.: 613,823

[22] Filed: May 25, 1984

[51] Int. Cl.$^4$ .................... G03C 1/60; G03F 7/08
[52] U.S. Cl. .................... 430/162; 430/156; 430/302
[58] Field of Search ................ 430/156, 162

[56] References Cited

U.S. PATENT DOCUMENTS

| | | | |
|---|---|---|---|
| 3,905,815 | 9/1975 | Bonham | 430/15 C |
| 4,233,390 | 11/1980 | Jargiello | 430/15 C |
| 4,299,893 | 11/1981 | Pigeon et al. | 430/293 |
| 4,334,003 | 6/1982 | Jones | 430/156 |
| 4,447,512 | 5/1984 | Rowe et al. | 430/17 |

FOREIGN PATENT DOCUMENTS 2044788 10/1980 United Kingdom ............. 430/175

Primary Examiner—Charles L. Bowers, Jr.
Attorney, Agent, or Firm—Richard P. Plunkett; William W. McDowell, Jr.

[57] ABSTRACT

A negative-working, water-developable, bilayer lithographic printing plate comprising a substrate having a hydrophilic surface which surface is first coated with a layer of a water-soluble, lithographically suitable, photosensitive, negative-working aromatic diazo composition and top coated with a layer of a water-permeable, water-insoluble, oleophilic, O-epoxyalkylated tetrakis (hydroxyphenyl) ethane resin and ester derivatives thereof. Upon imagewise exposure, the exposed areas become water insoluble, and development is effected by washing away the unexposed areas with water.

2 Claims, No Drawings

WATER-DEVELOPABLE, NEGATIVE-WORKING, DIAZO LITHOGRAPHIC PRINTING PLATE WITH OLEOPHILIC ESTER OVERLAYER

FIELD OF THE INVENTION

This invention relates to a presensitized sheet material and to graphic printing therewith and, more particularly, to a water-developable, photopolymerizable sheet capable of use as a lithographic printing plate.

BACKGROUND OF THE INVENTION

This invention relates to a method for the production of presensitized, lithographic printing plates and to novel lithographic printing plates obtained thereby. More particularly, this invention relates to a negative-working, water-developable, bilayer lithographic printing plate comprising a substrate having a hydrophilic surface, said surface being first coated with a layer of a water-soluble, lithographically suitable, photosensitive, negative-working, aromatic diazo composition and top coated with a layer of a water-permeable, water-insoluble, oleophilic, O-epoxyalkylated tetrakis (hydroxyphenyl) ethane resin and ester derivates thereof. Upon imagewise exposure, the exposed areas become water-insoluble and development is effected by washing away the unexposed areas with tap water.

The art in the lithographic printing plate area has always had a problem with development of the image. That is, various chemical developing substances are employed which must be discarded usually through community waste removal facilities. Not only are such developers costly to purchase but they also cause pollution problems on being discarded. Thus, a lithographic printing plate which is developable by ordinary tap water is commercially desirable.

DESCRIPTION OF THE PRIOR ART

A presensitized, lithographic plate having an organophilic, polymeric surface overlaying a light sensitive diazo layer supported by a hydrophilic surfaced base is described in U.S. Pat. No. 3,136,637. The overlayer exists in a polymeric state both before and after exposure of the plate and the actinic light received during exposure acts solely on the underlying light sensitive diazo resin to cause insolubilization thereof in the exposed areas. The plate is developable as a result of the differential soft mobility or solubility between the exposed and unexposed areas of the diazo resin layer. However, during development the overcoated resin layer due to its uniform nature tends to be removed in both the exposed areas as well as in the unexposed areas thereby negating its effective use.

U.S. Pat. No. 3,462,267 describes an improvement on the above system whereby the organophilic layer is a photocrosslinkable polymer which is insolubilized by the crosslinking action of pendant photolabile groups in the exposed area. However, the system also has the drawback that the organophilic layer of such lithographic plates is not developable in the same solutions as used for the diazo resin, necessitating two or more developing steps.

U.S. Pat. No. 3,179,518 teaches in the manufacture of lithographic printing plates the use of certain water soluble diazo type compositions which become water-insoluble upon imagewise exposure to UV radiation. Although this method allows for removal of non-exposed areas by development with water, the remaining imaged area cannot withstand the strain of prolonged printing, thereby requiring that an ink receptive lacquer or other similar coating be applied to the imaged area after development. Thus, it is this coating which actually prints the desired image and not the diazo.

U.S. Pat. No. 4,104,072 teaches a water-developable, lithographic printing plate consisting of a diazo layer on an aluminum sheet, said diazo layer being top coated with a layer consisting of an oleophilic resin in combination with a lithographically suitable, negative-working photosensitizer selected from the group consisting of the reaction product of the para-diazo-diphenylamineparaformaldehyde condensate with 2-hydroxy-4-methoxy benzophenone sulfonic acid and the azido pyrenes. The photosensitizer is a necessary component which binds the resin and renders the composition water impermeable after exposure to UV radiation.

SUMMARY OF THE INVENTION

The instant invention provides a lithographic printing plate which may be developed by use of ordinary tap water. The present invention provides a light sensitive plate comprising a substrate having a hydrophilic surface which surface is first coated with a layer of a water soluble, lithographically suitable, photosensitive, negative-working, aromatic diazo composition and top coated with a layer of a water-permeable, water-insoluble, oleophilic, O-epoxyalkylated tetrakis (hydroxyphenyl) ethane resin and ester derivatives thereof. Upon imagewise exposure to actinic radiation, the exposed areas become water-insoluble and development is conveniently and efficiently performed by washing away the unexposed areas with water. The resultant presensitized sheet is quite resistant to high humidity environments and accordingly exhibits good storage ability.

DETAILED DESCRIPTION OF THE INVENTION

The instant invention is directed to a water-developable, lithographic printing plate.

The first step in forming said plate is to provide a substrate. Suitable substrates for lithographic plates include metals (e.g., aluminum, copper, zinc), glass, paper and the like. Prior to application of the diazo resin to the surface of such substrate for lithographic purposes, it is generally necessary to passivate the surface to prevent any deleterious interaction between the surface and the diazo resin. Such passivating treatments may also help promote a firm bond between the exposed portions of the diazo resin and the substrate and they also aid in providing a hydrophilic surface during the lithographic printing process. The silicate treatment described in U.S. Pat. No. 2,714,066 is the preferred passivating treatment for metal substrates. Other passivating treatments are disclosed in U.S. Pat. No. 2,946,638 (zirconium hexahalide), U.S. Pat. No. 3,201,247 (phosphomolybdate treatment) and U.S. Pat. No. 3,148,984. Suitable coating techniques used to accomplish the same purpose are described in U.S. Pat. No. 3,161,517 and U.S. Pat. No. 3,196,785.

The water-soluble, lithographically suitable, photosensitive, negative-working, aromatic diazo compositions used as the first layer are known in the art and include polymeric diazonium compounds such as the reaction product of para-diazo-diphenylamine with paraformaldehyde e.g., the condensation product of 4-diazo-diphenylamine sulphate with formaldehyde and zinc chloride as the preferred diazonium compounds. Other diazonium compounds operable herein include, but are not limited to,
4-diazo-diphenylamine sulfate,
1-diazo-4-N,N-dimethylamino-benzene zinc chloride,
1-diazo-4-N,N-diethylamino-benzene zinc chloride,
1-diazo-4-N-ethyl-N-hydroxyethylamino-benzene, ½ zinc chloride,
1-diazo-4-N-methyl-N-hydroxyethylamino-benzene, ½ zinc chloride,
1-diazo-2,5-diethoxy-4-benzoylamino-benzene, ½ zinc chloride,
1-diazo-4-N-benzylamino-benzene, ½ zinc chloride,
1-diazo-4-N,N-dimethylamino-benzene borofluoride,
1-diazo-4-morpholino-benzene, ½ zinc chloride,
1-diazo-4-morpholino-benzene-borofluoride,
1-diazo-2,5-dimethoxy-4-p-tolylmercaptobenzene, ½ zinc chloride,
1-diazo-2-ethoxy-4-N,N-dimethylaminobenzene, ½ zinc chloride,
p-diazo-dimethyl aniline, ½ zinc chloride,
1-diazo-4-N,N-diethylamino-benzene, ½ zinc chloride,
1-diazo-2,5-dibutoxy-4-morpholino-benzene sulfate,
1-diazo-2,5-diethoxy-4-morpholino-benzene, ½ zinc chloride,
1-diazo-2,5-dimethoxy-4-morpholino-benzene, zinc chloride,
1-diazo-2,5-diethoxy-4-morpholino-benzene, ½ zinc chloride,
1-diazo-2,5-diethoxy-4-morpholino-benzene-borofluoride,
2-diazo-1-naphthol-5-sulfonic acid, sodium salt,
1-diazo-4-N,N-diethylamino-benzene, borofluoride,
1-diazo-2,5-diethoxy-4-p-tolylmercapto-benzene, ½ zinc chloride,
1-diazo-3-ethoxy-4-N-methyl-N-benzylamino-benzene, ½ zinc chloride,
1-diazo-3-chloro-4-N,N-diethylamino-benzene, ½ zinc chloride,
1-diazo-3-methyl-4-pyrrolidino-benzene chloride, zinc chloride,
1-diazo-3-methyl-4-pyrrolidino-benzene-borofluoride,
1-diazo-2-chloro-4-N,N-dimethylamino-5-methoxy-benzene, borofluoride and
1-diazo-3-methoxy-4-pyrrolidino benzene, zinc chloride.
Such materials are commercially available.

The top coat layer is a water-permeable, water-insoluble, oleophilic, O-epoxyalkylated tetrakis (hydroxyphenyl) ethane resin and ester derivatives thereof of the formula:

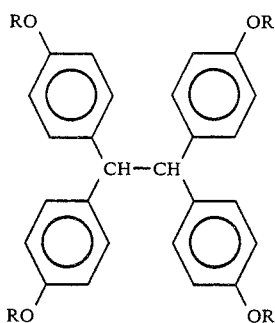

wherein R is a member of the group consisting of

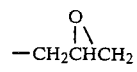

and

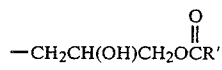

wherein R' is alkyl containing 1 to 14 carbon atoms, aryl containing 6 to 14 carbon atoms, aralkyl containing 6 to 14 carbon atoms,

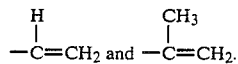

The ester derivatives are formed by reacting the O-epoxyalkylated tetrakis (hydroxyphenyl) ethane resin with aliphatic or aromatic acids such as acetic, benzoic, acrylic or methacrylic as will be shown by examples herein. One O-epoxyalkylated tetrakis (hydroxyphenyl) ethane resin which is commercially available is EPON-1031 from Shell Oil Co.

In the instance where R' of the oleophilic resin is

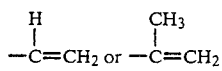

additional water insolubility of the layer and longer print runs are obtained by the cure of these groups on exposure to radiation. To facilitate said curing, a photoinitiator is usually admixed in the oleophilic resin layer. One class of photoinitiators are the aldehyde and ketone carbonyl compounds having at least one aromatic nucleus attached directly to the

group. Various photoinitiators in this class operable herein include, but are not limited to, benzophenone, acetophenone, o-methoxy-benzophenone, acenapthenequinone, methyl ethyl ketone, valerophenone, hexanophenone, alpha-phenylbutyrophenone, p-morpholinopropionphenone, dibenzosuberone, 4-morpholino-benzophenone, 4'-morpholino-deoxybenzoin, p-diacetyl-benzene, 4-aminobenzophenone, 4'-methoxyacetophenone, benzaldehyde, alpha-tetralone, 9-acetylphenanthrene, 2-acetyl-phenanthrene, 10-thioxanthenone, 3-acetyl-phenanthrene, 3-acetylindone, 9-fluorenone, 1-indanone, 1,3,5-triacetyl-benzene, thioxanthen-9-one, xanthrene-9-one, 7-H-benz[de]anthracen-7-one, 1-naphthaldehyde, 4,4'-bis(dimethylamino)benzophenone, fluorene-9-one, 1'-acetonaphthone, 2'-acetonaphthone, 2,3-butanedione, acetonaphthone, 2,3-butanedione, benz[a]anthracene 7.12 dione, etc. Another class of photoinitiators is the benzoin ethers, such as benzoin methyl ether, benzoin ethyl ether, benzoin isopropyl ether, benzoin isobutyl ether and 2,2-dimethoxy-2-phenylacetophenone. A third class of photoinitiators is exemplified by benzil dimethyl ketal. The photoinitiator or mixtures thereof are usually added in an amount ranging from 0.005 to 15% by weight of the oleophilic resin.

The aromatic diazo composition is applied as an aqueous solution (2–10% by weight) by any suitable means such as roll coating, whirl coating, spraying or hand wiping onto the suitable base sheet. After drying, the oleophilic resin or ester derivative thereof is applied as an organic solution (2–10% by weight) by any suitable means as described for the diazo composition. Solvents used with said oleophilic resin include, but are not limited to, methyl ethyl ketone, methyl isobutyl ketone, acetone and methyl cellosolve.

The diazo layer is applied to the base sheet at a coating weight of from about 5 to about 200 mg/sq. ft., preferably from about 10 to about 100 mg/sq. ft. The coating weight of the oleophilic top coat layer is from about 5 to about 300 mg/sq. ft. with a preferred range of from about 35 to about 200 mg/sq. ft.

As used herein, the term "water-permeable" means that the composition is insoluble in water but that water is able to permeate through a thin layer of the composition. In the instant invention the upper water-insoluble, oleophilic resin layer is water-permeable and remains water-permeable in the unexposed area after imagewise exposure. However, the lower diazo composition layer is initially water-soluble and becomes water-insoluble in the exposed area while remaining water-soluble in the unexposed area. Furthermore, in the exposed area the diazo composition binds together both with itself and also the base substrate and the upper oleophilic resin layer.

Thus, on developing an exposed plate with water, the water permeates the upper oleophilic layer in the unexposed region and dissolves the water-soluble, unexposed diazo composition thereunder allowing both layers to be removed from the plate thus exposing the base substrate. In the exposed image area the diazo composition is no longer water soluble and thus neither the upper oleophilic layer nor the diazo composition layer is removed. Since the image areas are oleophilic and ink receptive, while the non-image area, i.e., base substrate, is by its nature hydrophilic and oleophobic, a lithographic plate results.

The following examples are set out to explain, but expressly not limit, the instant invention. Unless otherwise noted, all parts and percentages are by weight.

EXAMPLE 1

Preparation of an Ester Derivative of an O-epoxyalkylated Tetrakis (Hydroxyphenyl) Ethane Resin To a 500 ml 3-neck round bottom flask equipped with a condenser and magnetic stirrer were charged 20 g of an epoxy resin sold under the tradename "EPON-1031" by Shell Oil Co., 9.2 g of acrylic acid, 2.0 g of triphenylphosphine as a catalyst and 240 ml of methyl ethyl ketone. The flask was heated and the solution allowed to reflux for a period of 64 hours. The reaction mixture was allowed to stand and cool for 2 days, filtered and concentrated. The esterified reaction product structure was confirmed by NMR. A yield of 32 g was obtained.

EXAMPLE 2

To a 500 ml 3-neck round bottom flask equipped with a condenser and magnetic stirrer were charged 20 g of an epoxy resin sold under the tradename "EPON-1031" by Shell Oil Co., 11.02 g of methacrylic acid, 2.0 g of triphenylphosphine as a catalyst and 240 ml of methyl ethyl ketone. The solution was heated to reflux temperature and refluxing was continued for a period of 64 hours. The reaction mixture was allowed to stand and cool for 2 days, filtered and concentrated. The esterified reaction product structure was confirmed by NMR. A yield of 36 g resulted.

EXAMPLE 3

To a 500 ml 3-neck round bottom flask equipped with stirrer and a reflux condenser were added 15 g of an epoxy resin sold under the tradename "EPON-1031" by Shell Oil Co., 1.25 g of triphenylphosphine as a catalyst, 5.78 g of gracial acetic acid and 200 ml of methyl ethyl ketone. The solution was heated to reflux and refluxing was continued for 57 hours. After cooling the reaction mixture was filtered and the filtrate was concentrated. The esterified reaction product structure was confirmed by NMR.

EXAMPLE 4

A solution of a diazo composition was prepared by dissolving 20 g of a diazo resin sold under the tradename "Diazo Resin No. 4, Type L" by Fairmount Chemical Co., Inc., in 500 ml of water. The coating was applied to three LKK silicated aluminum lithographic plates using a Western Lithocoater roll coater. Each of the dried plates was then recoated in the same manner with one of the solutions from Examples 1 to 3 prepared by dissolving 20 g of the product in 500 ml of methyl isobutyl ketone.

EXAMPLE 5

A plate was prepared by the method of Example 4 except that the oleophilic resin composition from Examples 1 to 3 was replaced with an epoxy resin sold under the tradename "EPON-1031" by Shell Oil Co.

EXAMPLE 6

Two plates were prepared by the method of Example 4 except that the solution of the composition from Examples 1 and 2 also contained 0.5 g of 2,2-dimethoxy-2-phenyl-acetophenone, a photoinitiator sold under the tradename "Irgacure-651" by Ciba-Geigy.

EXAMPLE 7

A plate was prepared by the method of Example 5 except that the solution of a diazo composition was prepared by dissolving 4 g of 4-diazo-diphenylamine sulfate in 100 ml of water and the coatings applied by hand wiping.

EXAMPLE 8

The presensitized plates obtained in Examples 4 to 6 were exposed through a contacting negative to a 1,000 W mercury lamp at a distance of 22 inches in a NuArc N1000 Platemaker set at 25 units exposure. The exposed plates were developed with tap water in 5 seconds and treated with Western A.G.E. finisher. The resulting plates readily accepted ink and printed in excess of 4,000 clean good quality copies.

EXAMPLE 9

The presensitized plate obtained in Example 7 was exposed and developed by the method used in Example 8 to give a suitable image.

We claim:

1. A negative-working, tap water-developable, bilayer lithographic printing plate comprising a substrate having a hydrophilic surface which is first coated with a layer of a water-soluble, lithographically suitable, photosensitive, negative-working aromatic diazo composition and top coated with a layer consisting of a water-permeable, water-insoluble, oleophilic ester derivative of an O-epoxyalkylated tetrakis (hydroxyphenyl) ethane resin of the formula:

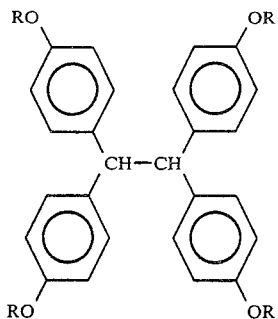

wherein R is

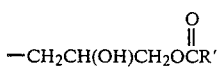

wherein R' is alkyl containing 1 to 14 carbon atoms, aryl containing 6 to 14 carbon atoms, aralkyl containing 6 to 14 carbon atoms,

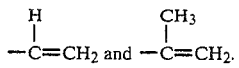

2. The printing plate according to claim 1 wherein R' of the top coat layer is a member of the group consisting of

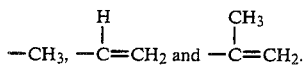

* * * * *